(12) United States Patent
Kim et al.

(10) Patent No.: US 9,406,261 B2
(45) Date of Patent: Aug. 2, 2016

(54) STAGE CIRCUIT AND SCAN DRIVER USING THE SAME

(71) Applicant: SAMSUNG DISPLAY CO., LTD., Yongin, Gyeonggi-Do (KR)

(72) Inventors: Yong-Jae Kim, Yongin (KR); Dong-Gyu Kim, Yongin (KR); Sung-Jae Moon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 115 days.

(21) Appl. No.: 14/276,980

(22) Filed: May 13, 2014

(65) Prior Publication Data

US 2014/0355733 A1 Dec. 4, 2014

(30) Foreign Application Priority Data

May 31, 2013 (KR) .................. 10-2013-0062657

(51) Int. Cl.
*G11C 19/00* (2006.01)
*G09G 3/32* (2016.01)
*G11C 19/28* (2006.01)

(52) U.S. Cl.
CPC .............. *G09G 3/3266* (2013.01); *G11C 19/28* (2013.01); *G09G 2310/0205* (2013.01); *G09G 2310/0286* (2013.01)

(58) Field of Classification Search
None
See application file for complete search history.

(56) References Cited

U.S. PATENT DOCUMENTS

| 6,788,757 B1* | 9/2004 | Lu | G11C 19/28 377/69 |
|---|---|---|---|
| 8,553,026 B2* | 10/2013 | Park | G09G 3/3266 345/212 |
| 8,912,996 B2* | 12/2014 | Kim | G09G 5/00 345/100 |
| 8,952,943 B2* | 2/2015 | Chung | G09G 3/3266 345/204 |
| 2009/0115792 A1* | 5/2009 | Otose | G11C 19/28 345/559 |
| 2011/0227883 A1 | 9/2011 | Chung | |
| 2012/0307959 A1* | 12/2012 | Furuta | G11C 19/184 377/64 |
| 2012/0327131 A1* | 12/2012 | Jang | G09G 3/3266 345/690 |
| 2013/0002615 A1 | 1/2013 | Kang et al. | |
| 2013/0120326 A1* | 5/2013 | Chung | G09G 3/3266 345/204 |
| 2014/0002423 A1* | 1/2014 | Choi | G09G 3/3688 345/204 |
| 2015/0061982 A1* | 3/2015 | Woo | G09G 3/3266 345/82 |

FOREIGN PATENT DOCUMENTS

| KR | 10-1065322 B1 | 9/2011 |
|---|---|---|
| KR | 10-2013-0000020 A | 1/2013 |
| KR | 10-2013-0003251 A | 1/2013 |

* cited by examiner

*Primary Examiner* — Tuan T Lam

(74) *Attorney, Agent, or Firm* — Lewis Roca Rothgerber Christie LLP

(57) ABSTRACT

A stage circuit and a scan driver, the stage circuit including a switch unit configured to selectively electrically couple a first node to one of a first input terminal and a second input terminal, a first driver coupled to the first node, to a second node, to a third node, to a first clock terminal, and to a second clock terminal, and a second driver coupled to the second node, to the third node, to a third clock terminal, and to a common terminal, and configured to output a scan signal to an output terminal.

26 Claims, 4 Drawing Sheets

STAGE CIRCUIT AND SCAN DRIVER USING THE SAME

CROSS-REFERENCE TO RELATED APPLICATION

This application claims priority to and the benefit of Korean Patent Application No. 10-2013-0062657, filed on May 31, 2013, in the Korean Intellectual Property Office, the entire contents of which are incorporated herein by reference in their entirety.

BACKGROUND

1. Field

An aspect of embodiments of the present invention relates to a stage circuit and a scan driver using the same, which can be employed in an organic light emitting display.

2. Description of the Related Art

Recently, various types of displays that are capable of reducing the weight and volume of cathode ray tubes have been developed. Such displays include liquid crystal displays, field emission displays, plasma display panels, organic light emitting displays, and the like.

The organic light emitting display, for example, includes a plurality of pixels for displaying images, and includes a scan driver capable of supplying a scan signal to the pixels via scan lines.

In general, the scan driver is driven by a progressive driving method in which a scan signal is progressively supplied to scan lines. However, a simultaneous driving method has also been used recently, wherein a scan signal is simultaneously supplied to scan lines according to the kind of pixel circuit used in the display driven by such a method.

SUMMARY

Embodiments of the present invention provide a stage circuit and a scan driver using the same, which has a simple circuit structure, and which can be driven by various methods including a progressive driving method, etc.

According to an aspect of an embodiment of the present invention, there is provided a stage circuit including a switch unit configured to selectively electrically couple a first node to one of a first input terminal and a second input terminal, a first driver coupled to the first node, to a second node, to a third node, to a first clock terminal, and to a second clock terminal, and a second driver coupled to the second node, to the third node, to a third clock terminal, and to a common terminal, and configured to output a scan signal to an output terminal.

The switch unit may include a first transistor coupled between the first input terminal and the first node, and having a gate electrode coupled to a first control terminal, and a second transistor coupled between the second input terminal and the first node, and having a gate electrode coupled to a second control terminal.

The second transistor may be in an off-state when the first transistor is in an on-state, and the second transistor may be in the on-state when the first transistor is in the off-state.

The first driver may include a third transistor coupled between the first clock terminal and a fourth transistor, and having a gate electrode coupled to the second clock terminal, the fourth transistor coupled between the third transistor and the second node, and having a gate electrode coupled to the first node, and a fifth transistor coupled between the first node and the third node, and having a gate electrode coupled to the second clock terminal.

The first driver may further include a first auxiliary transistor coupled between the third and fourth transistors, and having a gate electrode coupled to the second clock terminal, and a second auxiliary transistor coupled between the fifth transistor and the third node, and having a gate electrode coupled to the second clock terminal.

The first driver may further include a sixth transistor coupled between the second node and the first clock terminal, and having a gate electrode coupled to the first clock terminal.

The first driver may further include a third auxiliary transistor coupled between the sixth transistor and the second node, and having a gate electrode coupled to the first clock terminal.

The second driver may include a seventh transistor coupled between the common terminal and the output terminal, and having a gate electrode coupled to the second node, an eighth transistor coupled between the output terminal and a ninth transistor, and having a gate electrode coupled to the second node, the ninth transistor coupled between the eighth transistor and the third node, and having a gate electrode coupled to the third clock terminal, and a tenth transistor coupled between the third clock terminal and the output terminal, and having a gate electrode coupled to the third node.

The second driver may further include an eleventh transistor coupled between the third node and a first voltage terminal, and having a gate electrode coupled to the common terminal.

The second driver may further include a first capacitor coupled between the common terminal and the second node, and a second capacitor coupled between the third node and the output terminal.

The second driver may further include a fourth auxiliary transistor coupled between the eleventh transistor and the third node, and having a gate electrode coupled to the common terminal.

According to an aspect of another embodiment of the present invention, there is provided a scan driver including a plurality of stage circuits respectively coupled to scan lines and configured to supply a scan signal to the scan lines, wherein each stage circuit includes a switch unit configured to selectively electrically couple a first node to one of a first input terminal and a second input terminal, a first driver coupled to the first node, to a second node, to a third node, to a first clock terminal, and to a second clock terminal, and a second driver coupled to the second node, to the third node, to a third clock terminal, and to a common terminal, the second driver configured to output the scan signal to an output terminal.

The switch unit may include a first transistor coupled between the first input terminal and the first node, and having a gate electrode coupled to a first control terminal, and a second transistor coupled between the second input terminal and the first node, and having a gate electrode coupled to a second control terminal.

The second transistor may be in an off-state when the first transistor is in an on-state, and wherein the second transistor may be in the on-state when the first transistor is in the off-state.

The first driver may include a third transistor coupled between the first clock terminal and a fourth transistor, and having a gate electrode coupled to the second clock terminal, the fourth transistor coupled between the third transistor and the second node, and having a gate electrode coupled to the first node, and a fifth transistor coupled between the first node and the third node, and having a gate electrode coupled to the second clock terminal.

The first driver may further include a first auxiliary transistor coupled between the third and fourth transistors, and having a gate electrode coupled to the second clock terminal, and a second auxiliary transistor coupled between the fifth transistor and the third node, and having a gate electrode coupled to the second clock terminal.

The first driver may further include a sixth transistor coupled between the second node and the first clock terminal, and having a gate electrode coupled to the first clock terminal.

The first driver may further include a third auxiliary transistor coupled between the sixth transistor and the second node, and having a gate electrode coupled to the first clock terminal.

The second driver may include a seventh transistor coupled between the common terminal and the output terminal, and having a gate electrode coupled to the second node, an eighth transistor coupled between the output terminal and a ninth transistor, and having a gate electrode coupled to the second node, the ninth transistor coupled between the eighth transistor and the third node, and having a gate electrode coupled to the third clock terminal, and a tenth transistor coupled between the third clock terminal and the output terminal, and having a gate electrode coupled to the third node.

The second driver may further include an eleventh transistor coupled between the third node and a first voltage terminal, and having a gate electrode coupled to the common terminal.

The second driver may further include a first capacitor coupled between the common terminal and the second node, and a second capacitor coupled between the third node and the output terminal.

The second driver may further include a fourth auxiliary transistor coupled between the eleventh transistor and the third node, and having a gate electrode coupled to the common terminal.

The first input terminal of a k-th stage circuit of the stage circuits may be coupled to the output terminal of a (k−1)-th stage circuit of the stage circuits, the second input terminal the k-th stage circuit may be coupled to the output terminal of a (k−2)-th stage circuit of the stage circuits, and k may be a natural number of 3 or more.

A first stage circuit of the stage circuits may be configured to receive a start signal supplied to the first input terminal and the second input terminal of the first stage circuit.

The first input terminal of a second stage circuit of the stage circuits may be coupled to the output terminal of the first stage circuit, and the second input terminal of the second stage circuit may be configured to receive the start signal.

Differently phased clock signals may be supplied to the first clock terminal, to the second clock terminal, and to the third clock terminal, respectively.

DETAILED DESCRIPTION

Figure 1:
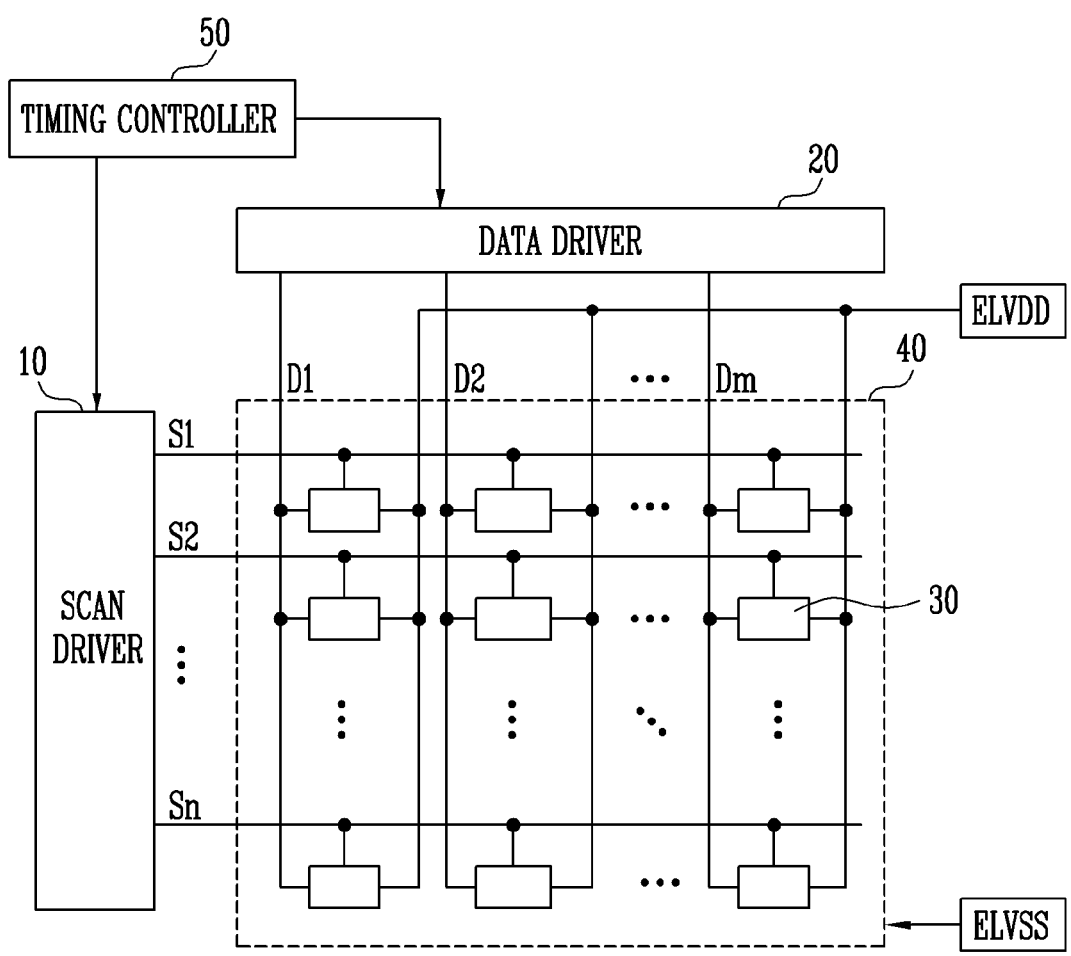
FIG. 1 is a block diagram illustrating an organic light emitting display according to an embodiment of the present invention.

Hereinafter, certain exemplary embodiments according to the present invention will be described more fully with reference to the accompanying drawings. However, the example embodiments may be embodied in different forms, and should not be construed as limited to the descriptions of the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. It will be understood that when an element is referred to as being "between" two elements, it may be the only element between the two elements, or one or more intervening elements may also be present. Like reference numerals refer to like elements throughout.

When a first element is described as being coupled to a second element, the first element can be directly coupled to the second element, or the first element can be indirectly coupled to the second element via one or more other elements. Further, some of the elements that are not essential to the complete understanding of the embodiments of the invention are omitted for clarity. Also, like reference numerals refer to like elements throughout.

FIG. 1 is a block diagram illustrating an organic light emitting display according to an embodiment of the present invention. Referring to FIG. 1, the organic light emitting display according to the present embodiment may include a pixel unit 40 including pixels 30 positioned at intersection portions of scan lines S1 to Sn and data lines D1 to Dm, a scan driver 10 configured to drive the scan lines S1 to Sn, a data driver 20 configured to drive the data lines D1 to Dm, and a timing controller 50 configured to control the scan driver 10 and the data driver 20.

Each pixel 30 receiving first and second driving voltages ELVDD and ELVSS, which may be externally supplied to the organic light emitting display, may generate light corresponding to a data signal as a result of current flowing from the first driving voltage ELVDD to the second driving voltage ELVSS via an organic light emitting diode of the pixel 30.

The scan driver 10 generates a scan signal under the control of the timing controller 50, and supplies the generated scan signal to the scan lines S1 to Sn. The data driver 20 generates a data signal under the control of the timing controller 50, and supplies the generated data signal to the data lines D1 to Dm. If the scan signal is supplied to the scan lines S1 to Sn, pixels 10 may be selected for each of the scan lines S1 to SN, and the selected pixels 10 may receive a corresponding data signal supplied from the data lines D1 to Dm.

In the present embodiment, the scan driver 10 may be operated using a progressive driving method in which the scan signal is progressively supplied to the scan lines S1 to Sn. For example, the scan driver 10 may progressively/sequentially supply the scan signal from the first scan line S1 to the n-th scan line Sn.

The scan driver 10 of the present embodiment may also progressively supply the scan signal to groups or pairs of scan lines (e.g., a modified progressive driving method). For example, the scan driver 10 may simultaneously supply the scan signal to the first and second scan lines S1 and S2, and may then simultaneously supply the scan signal to the third and fourth scan lines S3 and S4.

The scan driver 10 of the present embodiment may also be operated using a simultaneous driving method in which the scan signal is simultaneously supplied to all of the scan lines S1 to Sn.

Figure 2:
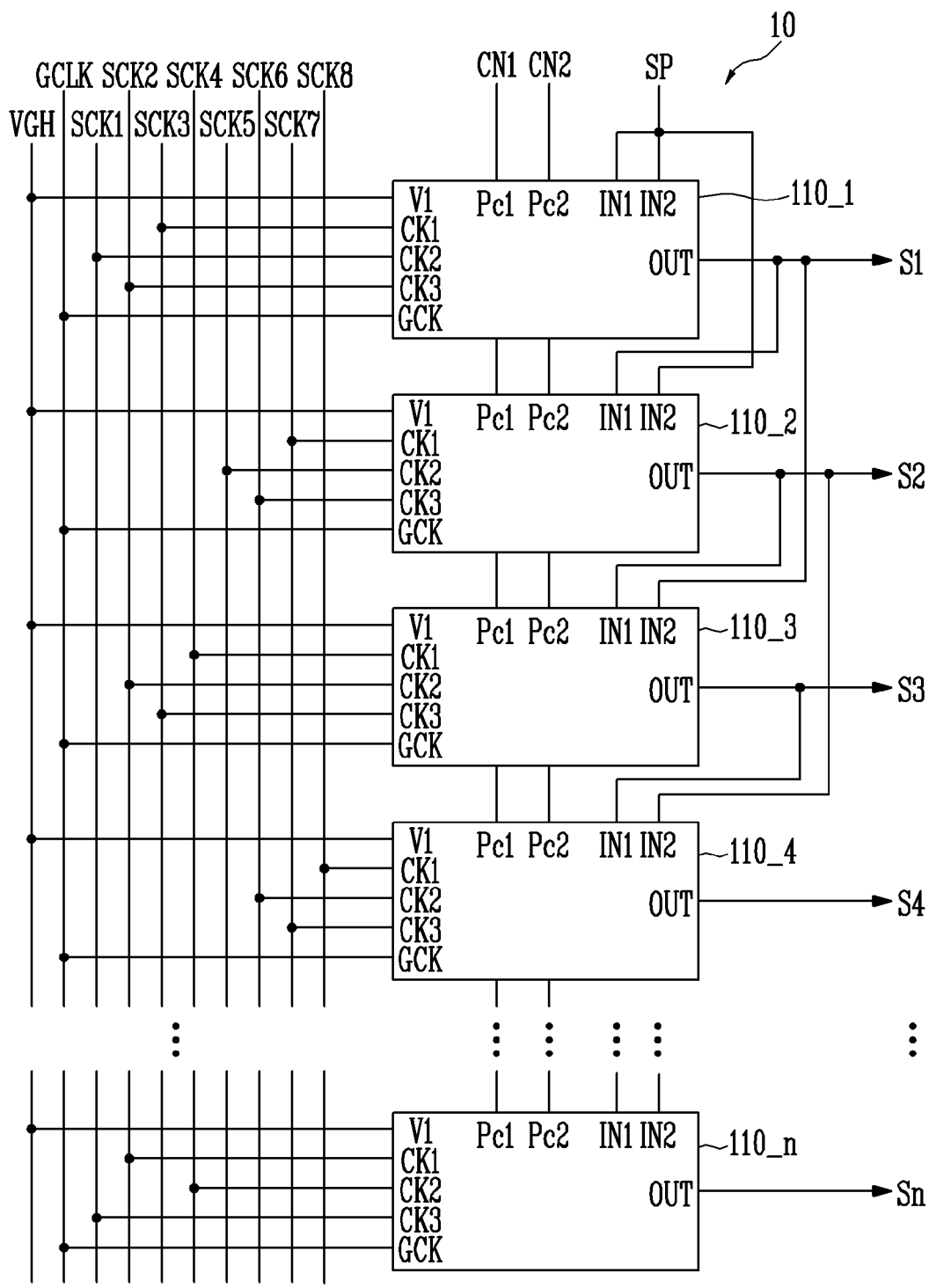
FIG. 2 is a diagram illustrating a scan driver according to the embodiment of the present invention shown in FIG. 1.

FIG. 2 is a diagram illustrating the scan driver according to the present embodiment of the present invention. Referring to FIG. 2, the scan driver 10 according to the present embodiment includes a plurality of stage circuits 110_1 to 110_n.

The stage circuits 110_1 to 110_n may be coupled to respective ones of the scan lines S1 to Sn through respective output terminals OUT. Accordingly, an n-th stage circuit 110_n may be coupled to the n-th scan line Sn so as to be able to output a scan signal to the n-th scan line. Further, and for example, a first stage circuit 110_1 may be coupled to the first scan line S1 so as to be able to output the scan signal to the first scan line S1, and a second stage circuit 110_2 may be coupled to the second scan line S2 so as to output the scan signal to the second scan line S2.

Each of the stage circuits 110_1 to 110_n may receive predetermined clock signals input through first, second, and third clock terminals CLK1, CLK2 and CLK3.

Each of the stage circuits 110_1 to 110_n may receive a first voltage VGH input through a first voltage terminal V1. Also, each of the stage circuits 110_1 to 110_n may receive first and second control signals CN1 and CN2 respectively input through first and second control terminals Pc1 and Pc2. Additionally, each of the stage circuits 110_1 to 110_n may have first and second input terminals IN1 and IN2.

In the present embodiment, the first input terminal IN1 of a k-th (k is a natural number of 3 or more) stage circuit 110_k may be coupled to the output terminal OUT of a (k−1)-th stage circuit 110_k−1, and the second input terminal IN2 of the k-th stage circuit 110_k may be coupled to the output terminal OUT of a (k−2)-th stage circuit 110_k−2.

A start signal SP may be supplied to the first and second input terminals IN1 and IN2 of the first stage circuit 110_1. The first input terminal IN1 of the second stage circuit 110_2 may be coupled to the output terminal OUT of the first stage circuit 110_1, and the start signal SP may be supplied to the second input terminal IN2 of the second stage circuit 110_2.

Additionally, each of the stage circuits 110_1 to 110_n may receive a common signal GCLK input through a common terminal GCK.

Figure 3:
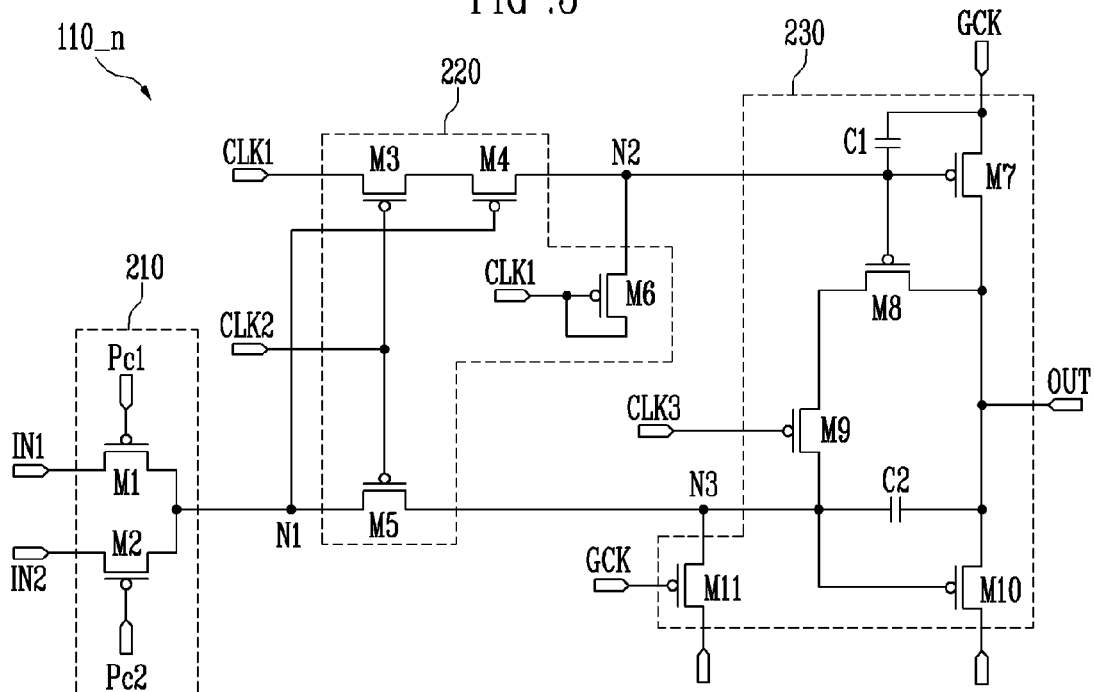
FIG. 3 is a circuit diagram illustrating a stage circuit according to an embodiment of the present invention.

FIG. 3 is a circuit diagram illustrating a stage circuit according to an embodiment of the present invention. For convenience of illustration, an n-th stage circuit 110_n is representatively shown in FIG. 3. Referring to FIG. 3, the stage circuit 110_n according to the present embodiment may include a switch unit 210, a first driver 220, and a second driver 230.

The switch unit 210 may selectively allow any one of first and second input terminals IN1 and IN2 to be electrically coupled to a first node N1. In the present embodiment, the switch unit 210 may include first and second transistors M1 and M2.

The first transistor M1 is coupled between the first input terminal IN1 and the first node N1, wherein a first electrode of the first transistor M1 is coupled to the first input terminal IN1, and a second electrode of the first transistor M1 is coupled to the first node N1. Further, a gate electrode of the first transistor M1 is coupled to the first control terminal Pc1. Accordingly, the on-off function of the first transistor M1 can be controlled by a first control signal CN1 supplied to the first control terminal Pc1.

The second transistor M2 is coupled between the second input terminal IN2 and the first node N1, wherein a first electrode of the second transistor M2 is coupled to the second input terminal IN2, and a second electrode of the second transistor M2 is coupled to the first node N1. Further, a gate electrode of the second transistor M2 is coupled to the second control terminal Pc2. Accordingly, the on-off function of the second transistor M2 can be controlled by a second control signal CN2 supplied to the second control terminal Pc2.

In the present embodiment, the first and second transistors M1 and M2 may be oppositely operated. For example, when the first transistor M1 is in an on-state, the second transistor M2 may be set in an off-state, and when the first transistor M1 is in the off-state, the second transistor M2 may be set in the on-state.

The first driver 220 may be coupled to the first node N1, to a second node N2, to a third node N3, to a first clock terminal CLK1, and to a second clock terminal CLK2. In the present embodiment, the first driver 220 may include a third transistor M3, a fourth transistor M4, a fifth transistor M5, and a sixth transistor M6.

The third transistor M3 is coupled between the first clock terminal CLK1 and the fourth transistor M4, wherein a first electrode of the third transistor M3 is coupled to the first clock terminal CLK1, and a second electrode of the third transistor M3 is coupled to the fourth transistor M4. A gate electrode of the third transistor M3 is coupled to a second clock terminal CLK2. Accordingly, the on-off function of the third transistor M3 can be controlled by a clock signal supplied to the second clock terminal CLK2.

The fourth transistor M4 is coupled between the third transistor M3 and the second node N2, wherein a first electrode of the fourth transistor M4 is coupled to the third transistor M3, and a second electrode of the fourth transistor M4 is coupled to the second node N2. A gate electrode of the fourth transistor M4 is coupled to the first node N1. Accordingly, the on-off function of the fourth transistor M4 can be controlled by, or determined according to, a voltage at the first node N1.

The fifth transistor M5 is coupled between the first and third nodes N1 and N3, wherein a first electrode of the fifth transistor M5 is coupled to the first node N1, and a second electrode of the fifth transistor M5 is coupled to the third node N3. A gate electrode of the fifth transistor M5 is coupled to the second clock terminal CLK2. Accordingly, the on-off function of the fifth transistor M5 can be controlled by the clock signal supplied to the second clock CLK2.

The sixth transistor M6 is coupled between the second node N2 and the first clock terminal CLK1, wherein a first electrode of the sixth transistor M6 is coupled to the second node N2, and a second electrode of the sixth transistor M6 is coupled to the first clock terminal CLK1. A gate electrode of the sixth transistor M6 is also coupled to the first clock terminal CLK1. Accordingly, the on-off function of the sixth transistor M6 can be controlled by a clock signal supplied to the first clock terminal CLK1.

The second driver 230 is coupled to a first voltage terminal V1, to the second node N2, to the third node N3, to the third clock terminal CLK3, and to the common terminal GCK. The second driver 230 outputs a scan signal to an output terminal OUT thereof.

In the present embodiment, the second driver 230 may include a seventh transistor M7, an eighth transistor M8, a ninth transistor M9, a tenth transistor M10, and an eleventh transistor M11. The second driver 230 may further include a first capacitor C1 and a second capacitor C2.

The seventh transistor M7 is coupled between the common terminal GCK and the output terminal OUT, wherein a first electrode of the seventh transistor M7 is coupled to the common terminal GCK, and a second electrode of the seventh transistor M7 is coupled to the output terminal OUT. A gate electrode of the seventh transistor M7 is coupled to the second node N2. Accordingly, the on-off function of the seventh transistor M7 can be controlled by a voltage at the second node N2.

The eighth transistor M8 is coupled between the output terminal OUT and the ninth transistor M9, wherein a first electrode of the eighth transistor M8 is coupled to the output terminal OUT, and a second electrode of the eighth transistor M8 is coupled to the ninth transistor M9. A gate electrode of the eighth transistor M8 is coupled to the second node N2. Accordingly, the on-off function of the eighth transistor M8 can be controlled by the voltage at the second node N2.

The ninth transistor M9 is coupled between the eighth transistor M8 and the third node N3, wherein a first electrode of the ninth transistor M9 is coupled to the eighth transistor M8, and a second electrode of the ninth transistor M9 is coupled to the third node N3. A gate electrode of the ninth transistor M9 is coupled to the third clock terminal CLK3. Accordingly, the on-off function of the ninth transistor M9 can be controlled by a clock signal supplied to the third clock terminal CLK3.

The tenth transistor M10 is coupled between the third clock terminal CLK3 and the output terminal OUT, wherein a first electrode of the tenth transistor M10 is coupled to the output terminal OUT, and a second electrode of the tenth transistor M10 is coupled to the third clock terminal CLK3. A gate electrode of the tenth transistor M10 is coupled to the third node N3. Accordingly, the on-off function of the tenth transistor M10 can be controlled by a voltage at the third node N3.

The eleventh transistor M11 is coupled between the third node N3 and the first voltage terminal V1, wherein a first electrode of the eleventh transistor M11 is coupled to the third node N3, and a second electrode of the eleventh transistor M11 is coupled to the first voltage terminal V1. A gate electrode of the eleventh transistor M11 is coupled to the common terminal GCK. Accordingly, the on-off function of the eleventh transistor M11 can be controlled by a common signal GCLK supplied to the common terminal GCK.

The first capacitor C1 may be coupled between the common terminal GCK and the second node N2, and the second capacitor C2 may be coupled between the third node N3 and the output terminal OUT.

Figure 4:
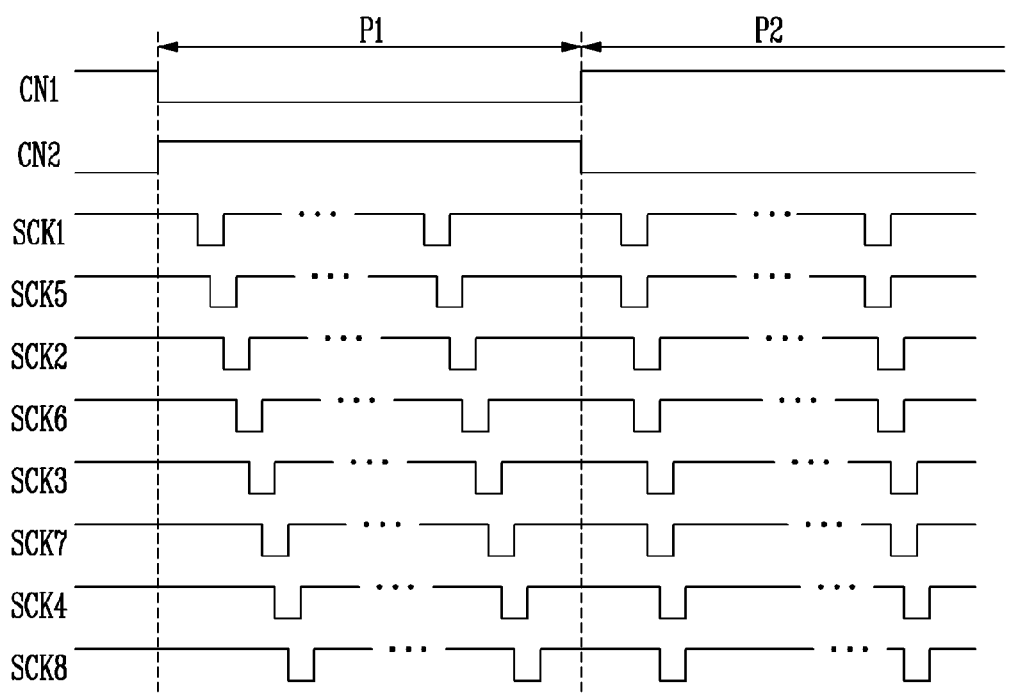
FIG. 4 is a waveform diagram illustrating clock signals supplied to the scan driver according to an embodiment of the present invention.

FIG. 4 is a waveform diagram illustrating clock signals supplied to the scan driver according to an embodiment of the present invention. Referring to FIG. 4, a first clock signal SCK1, a second clock signal SCK2, a third clock signal SCK3, a fourth clock signal SCK4, a fifth clock signal SCK5, a sixth clock signal SCK6, a seventh clock signal SCK7, and an eighth clock signal SCK8 may be supplied to the scan driver 10. For example, the clock signals SCK1 to SCK8 may be progressively supplied during a first period P1.

In addition, the clock signals SCK1 to SCK8 may be repetitively supplied during the first period P1. That is, as shown in FIG. 4, the first clock signal SCK1, the fifth clock signal SCK5, the second clock signal SCK2, the sixth clock signal SCK6, the third clock signal SCK3, the seventh clock signal SCK7, the fourth clock signal SCK4, and the eight clock signal SCK8 may be supplied in sequence (e.g., in the stated order).

Although FIG. 4 shows that adjacent clock signals partially overlap with each other, the clock signals may be supplied such that adjacent clock signals do not overlap with each other.

For example, a specific clock signal making a pair with another clock signal may be simultaneously supplied during a second period P2. As shown in FIG. 4, the first clock signal SCK1 may be simultaneously supplied together with the fifth clock signal SCK5, and the second clock signal SCK2 may be simultaneously supplied together with the sixth clock signal SCK6.

In addition, the third clock signal SCK3 may be simultaneously supplied together with the seventh clock signal SCK7, and the fourth clock signal SCK4 may be simultaneously supplied together with the eighth clock signal SCK8.

In the present embodiment, one pair of clock signals may be supplied later than another pair of clock signals. For example, after the first and fifth clock signals SCK1 and SCK5 are simultaneously supplied, the second and sixth clock signals SCK2 and SCK6 may be simultaneously supplied (noting that the second and sixth clock signals SCK2 and SCK6 may partially overlap with the first and fifth clock signals SCK1 and SCK5). Subsequently, the third and seventh clock signals SCK3 and SCK7 may be simultaneously supplied, and subsequent to that, the fourth and eighth clock signals SCK4 and SCK8 may be simultaneously supplied.

Furthermore, each of the clock signals SCK1 to SCK8 may be repetitively supplied during the second period P2.

Figure 5:
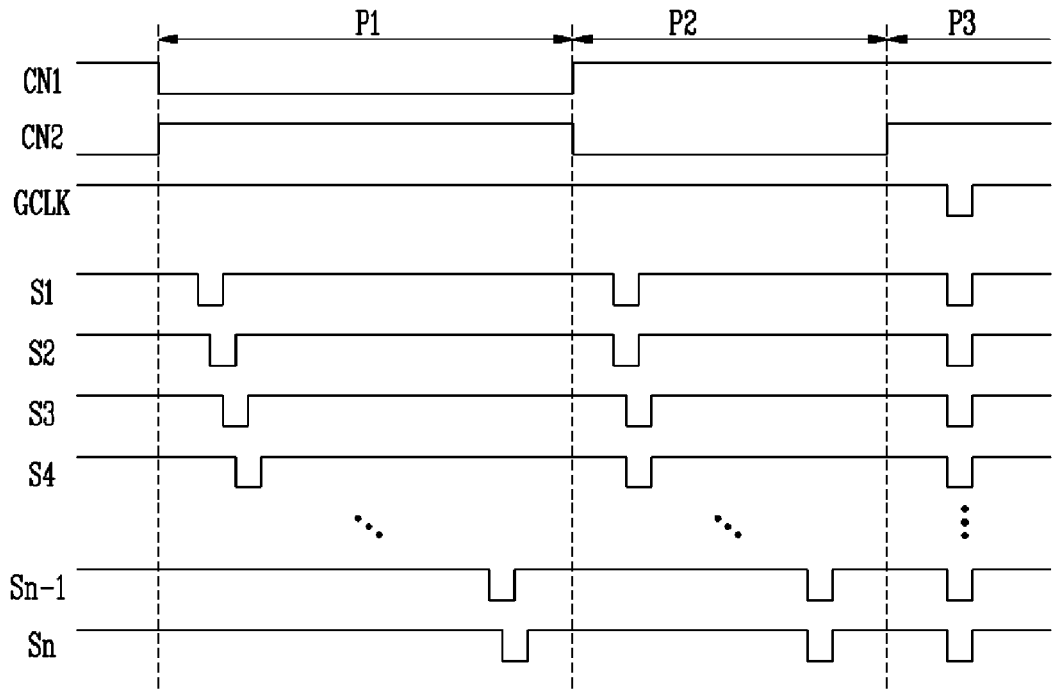
FIG. 5 is a waveform diagram illustrating an operation of the scan driver according to an embodiment of the present invention.

FIG. 5 is a waveform diagram illustrating an operation of the scan driver according to the present embodiment of the present invention. Hereinafter, the operation of the scan driver 10 according to the present embodiment will be described with reference to FIG. 5. FIG. 5 shows the scan driver 10 operated using a general simultaneous driving method during a first period P1. That is, the scan driver 10 of the present embodiment may progressively supply scan signals to the respective scan lines S1 to Sn.

Although FIG. 5 illustrates that adjacent scan signals partially overlap with each other, the scan signals may be supplied such that adjacent signals do not overlap with each other.

To this end, the first control signal CN1 may be supplied to each of the stage circuits 110_1 to 110_n during the first period P1, while conversely, the second control signal CN2 might not be supplied to each of the stage circuits 110_1 to 110_n during the first period P1. Thus, the first control signal CN1 is supplied to the first control terminal Pc1 of each of the stage circuits 110_1 to 110_n, and accordingly, the first transistor M1 of the switch unit 210 can maintain the on-state during the first period P1.

Conversely, if the second control signal CN2 is not supplied during the first period P1, the second transistor M2 of the switch unit 210 can maintain the off-state during the first period P1. Thus, during the first period P1, the first input terminal IN1 of each of the stage circuits 110_1 to 110_n can be electrically coupled to the first node N1, and the second input terminal IN2 of each of the stage circuits 110_1 to 110_n can be electrically disconnected from the first node N1.

Therefore, the first nodes N1 of the second stage circuit 110_2 to the n-th stage circuit 100_n may be coupled through the first input terminals IN1 thereof to the output terminals OUT of respective previous stage circuits 110_1 to 110_n−1.

Thus, an i-th (i is a natural number of 2 or more) stage circuit 110_i receives a scan signal output from the output terminal OUT of the previous stage circuit 110_i−1, input through the first input terminal IN1 of the i-th stage circuit 110_i, and outputs a scan signal to the output terminal OUT of the i-th stage circuit 110_i corresponding to the received scan signal.

In addition, an (i+1)-th stage circuit 110_i+1 receives a scan signal output from the output terminal OUT of the i-th stage circuit 110_i, input through the first input terminal IN1 of the (i+1)-th stage circuit 110_i+1, and outputs a scan signal to the output terminal OUT of the (i+1)-th stage circuit 110_i+1 corresponding to the received scan signal.

Accordingly, the scan signal can be progressively supplied to the scan lines S1 to Sn.

A case where the scan driver 10 is operated using a modified simultaneous driving method during a second period P2 is shown in FIG. 5. That is, the scan driver 10 may progressively supply a scan signal to groups, each of which including a pair of the scan lines S1 to Sn.

To this end, the second control signal CN2 may be supplied to the stage circuits 110_1 to 110_n during the second period P2, while the first control signal CN1 is not supplied to the stage circuits 110_1 to 110_n during the second period P2. Thus, the second control signal CN2 is supplied to the second control terminal Pc2 of each of the stage circuits 110_1 to 110_n, and accordingly, the second transistor M2 of the switch unit 210 can maintain the on-state during the second period P2. Conversely, because the first control signal CN1 is not supplied, the first transistor M1 of the switch unit 210 can maintain the off-state during the second period P2.

Accordingly, the second input terminal IN2 of each of the stage circuits 110_1 to 110_n can be electrically coupled to their respective first node N1, and the first input terminal IN1 of each of the stage circuits 110_1 to 110_n can be electrically decoupled from the first node N1. Therefore, the first node N1 of the k-th stage circuit 110_k may be coupled to the output terminal OUT of the (k−2)-th stage circuit 110_k−2 through the second input terminal IN2 of the k-th stage circuit 110_k.

The start signal SP may be simultaneously supplied to the first nodes N1 of the first and second stage circuits 110_1 and 110_2. Accordingly, the driving of the first and second stage circuits 110_1 and 110_2 can be simultaneously started, and a scan signal can be simultaneously supplied to the first and second scan lines S1 and S2.

The scan signal output to the first scan line S1 is supplied to the first node N1 of the third stage circuit 110_3 through the second input terminal IN2 of the third stage circuit 110_3, and the scan signal output to the second scan line S2 is supplied to the first node N1 of the fourth stage circuit 110_4 through the second input terminal IN2 of the fourth stage circuit 110_4. Thus, the driving of the third and fourth stage circuits 110_3 and 110_4 can be simultaneously started, and a scan signal can be simultaneously output to the third and fourth scan lines S3 and S4. The modified progressive driving method described above can be continuously performed.

FIG. 5 shows the scan driver 10 operated using a simultaneous driving method during a third period P3. That is, the scan driver 10 may simultaneously supply a scan signal to all the scan lines S1 to Sn. To this end, the common signal GCLK may be simultaneously supplied to the stage circuits 110_1 to 110_n during the third period P3. Accordingly, the common signal GCLK supplied to the common terminal GCK of each of the stage circuits 110_1 to 110_n can be supplied to the output terminal OUT through the seventh transistor M7. Thus, the scan signal can be simultaneously output from the output terminals OUT of the stage circuits 110_1 to 110_n.

In the present embodiment, the eleventh transistor M11 is preferably provided to ensure the tenth transistor M10 is maintained in the off-state when intended to be in the off-state. That is, the eleventh transistor M11 is turned on under the supply of the common signal GCLK, so that the first voltage VGH of a high level, which is applied to the first voltage terminal V1, can be applied to the third node N3, which is coupled to the tenth transistor M10.

Figure 6:
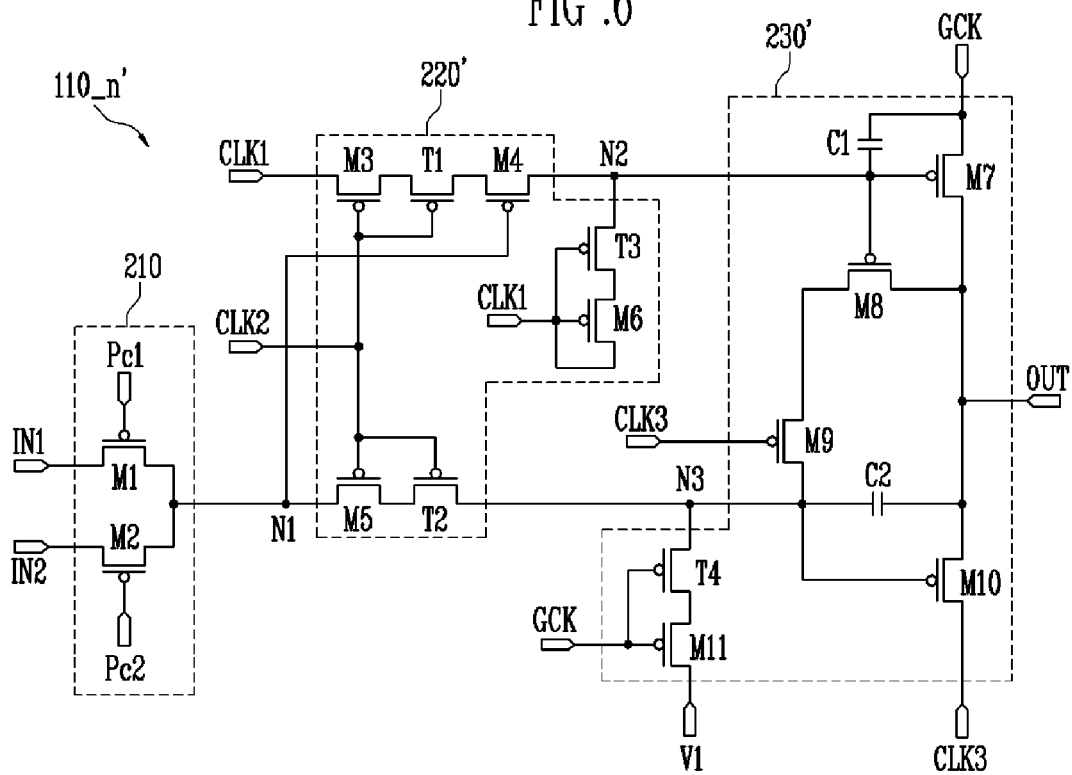
FIG. 6 is a circuit diagram illustrating a stage circuit according to an embodiment of the present invention.

FIG. 6 is a circuit diagram illustrating a stage circuit according to another embodiment of the present invention. Referring to FIG. 6, the stage circuit 110_n' according to the present embodiment may further include (in addition to the components of the stage circuit 110_n shown in FIG. 3) a first auxiliary transistor T1, a second auxiliary transistor T2, a third auxiliary transistor T3, and a fourth auxiliary transistor T4. The auxiliary transistors T1 to T4 are respectively provided for the purpose of reducing leakage current existing in the third, fifth, sixth and eleventh transistors M3, M5, M6 and M11.

The first auxiliary transistor T1 is coupled between the third and fourth transistors M3 and M4. A gate electrode of the first auxiliary transistor T1 is coupled to the second clock terminal CLK2. Thus, the first auxiliary transistor T1 can be controlled identically to the third transistor M3.

Although FIG. 6 illustrates only one first auxiliary transistor T1 in the stage circuit, a plurality of first auxiliary transistors T1 may exist in other embodiments of the present invention, wherein the plurality of first auxiliary transistors T1 may be, for example, coupled in series between the third and fourth transistors M3 and M4.

The second auxiliary transistor T2 is coupled between the fifth transistor M5 and the third node N3. A gate electrode of the second auxiliary transistor T2 is coupled to the second clock terminal CLK2. Thus, the second auxiliary transistor T2 can be controlled identically to, or simultaneously with, the fifth transistor M5.

Although FIG. 6 illustrates that one second auxiliary transistor T2 exists in the stage circuit, a plurality of second auxiliary transistors T2 may exist in other embodiments of the present invention, wherein the plurality of second auxiliary transistors T2 may be, for example, coupled in series between the fifth transistor M5 and the third node N3.

The third auxiliary transistor T3 is coupled between the sixth transistor M6 and the second node N2. A gate electrode of the third auxiliary transistor T3 is coupled to the first clock terminal CLK1. Thus, the third auxiliary transistor T3 can be controlled at the same time as, or identically to, the sixth transistor M6.

Although FIG. 6 illustrates that one third auxiliary transistor T3 exists in the stage circuit, a plurality of third auxiliary transistors T3 may exist in other embodiments of the present invention, wherein the plurality of third auxiliary transistors T3 may be, for example, coupled in series between the sixth transistor M6 and the second node N2.

The fourth auxiliary transistor T4 is coupled between the eleventh transistor M11 and the third node N3. A gate electrode of the fourth auxiliary transistor T4 is coupled to the common terminal GCK. Thus, the fourth auxiliary transistor T4 can be controlled with, or identically to, the eleventh transistor M11.

Although FIG. 6 illustrates that one fourth auxiliary transistor T4 exists in the stage circuit, a plurality of fourth auxiliary transistors T4 may exist in other embodiments of the present invention, wherein the plurality of fourth auxiliary transistors T4 may be, for example, coupled in series between the eleventh transistor M11 and the third node N3.

By way of summation and review, according to embodiments of the present invention, it is possible to provide a stage circuit and a scan driver using the same, which has a simple circuit structure and can be driven by various methods including a progressive driving method, etc.

Example embodiments of the present invention have been disclosed herein, and although specific terms are employed, they are used in, and are to be interpreted in, a generic and descriptive sense only, and are not used for purpose of limitation, and are should not be interpreted as limiting. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A stage circuit comprising:
    a switch unit configured to selectively electrically couple a first node to one of a first input terminal and a second input terminal;
    a first driver coupled to the first node, to a second node, to a third node, to a first clock terminal configured to receive a first clock signal, and to a second clock terminal configured to receive a second clock signal; and
    a second driver coupled to the second node, to the third node, to a third clock terminal configured to receive a third clock signal, and to a common terminal, and configured to output a scan signal to an output terminal,
    wherein the first clock signal, the second clock signal, and the third clock signal are different, and
    wherein the stage circuit is configured to receive the third clock signal before the first clock signal and after the second clock signal.

2. The stage circuit of claim 1, wherein the switch unit comprises:
    a first transistor coupled between the first input terminal and the first node, and having a gate electrode coupled to a first control terminal; and
    a second transistor coupled between the second input terminal and the first node, and having a gate electrode coupled to a second control terminal.

3. The stage circuit of claim 2, wherein the second transistor is in an off-state when the first transistor is in an on-state, and
    wherein the second transistor is in the on-state when the first transistor is in the off-state.

4. The stage circuit of claim 1, wherein the first driver comprises:
    a third transistor coupled between the first clock terminal and a fourth transistor, and having a gate electrode coupled to the second clock terminal;
    the fourth transistor coupled between the third transistor and the second node, and having a gate electrode coupled to the first node; and
    a fifth transistor coupled between the first node and the third node, and having a gate electrode coupled to the second clock terminal.

5. The stage circuit of claim 4, wherein the first driver further comprises:
    a first auxiliary transistor coupled between the third and fourth transistors, and having a gate electrode coupled to the second clock terminal; and
    a second auxiliary transistor coupled between the fifth transistor and the third node, and having a gate electrode coupled to the second clock terminal.

6. The stage circuit of claim 4, wherein the first driver further comprises a sixth transistor coupled between the second node and the first clock terminal, and having a gate electrode coupled to the first clock terminal.

7. The stage circuit of claim 6, wherein the first driver further comprises a third auxiliary transistor coupled between the sixth transistor and the second node, and having a gate electrode coupled to the first clock terminal.

8. The stage circuit of claim 1, wherein the second driver comprises:
    a seventh transistor coupled between the common terminal and the output terminal, and having a gate electrode coupled to the second node;
    an eighth transistor coupled between the output terminal and a ninth transistor, and having a gate electrode coupled to the second node;
    the ninth transistor coupled between the eighth transistor and the third node, and having a gate electrode coupled to the third clock terminal; and
    a tenth transistor coupled between the third clock terminal and the output terminal, and having a gate electrode coupled to the third node.

9. The stage circuit of claim 8, wherein the second driver further comprises an eleventh transistor coupled between the third node and a first voltage terminal, and having a gate electrode coupled to the common terminal.

10. The stage circuit of claim 9, wherein the second driver further comprises:
    a first capacitor coupled between the common terminal and the second node; and
    a second capacitor coupled between the third node and the output terminal.

11. The stage circuit of claim 9, wherein the second driver further comprises a fourth auxiliary transistor coupled between the eleventh transistor and the third node, and having a gate electrode coupled to the common terminal.

12. A scan driver comprising:
    a plurality of stage circuits respectively coupled to scan lines and configured to supply a scan signal to the scan lines, wherein each stage circuit comprises:
    a switch unit configured to selectively electrically couple a first node to one of a first input terminal and a second input terminal;
    a first driver coupled to the first node, to a second node, to a third node, to a first clock terminal configured to receive a first clock signal, and to a second clock terminal configured to receive a second clock signal; and
    a second driver coupled to the second node, to the third node, to a third clock terminal configured to receive a third clock signal, and to a common terminal, the second driver configured to output the scan signal to an output terminal,
    wherein the first clock signal, the second clock signal, and the third clock signal are different, and
    wherein the stage circuit is configured to receive the third clock signal before the first clock signal and after the second clock signal.

13. The scan driver of claim 12, wherein the switch unit comprises:
    a first transistor coupled between the first input terminal and the first node, and having a gate electrode coupled to a first control terminal; and
    a second transistor coupled between the second input terminal and the first node, and having a gate electrode coupled to a second control terminal.

14. The scan driver of claim 13, wherein the second transistor is in an off-state when the first transistor is in an on-state, and
    wherein the second transistor is in the on-state when the first transistor is in the off-state.

15. The scan driver of claim 12, wherein the first driver comprises:
a third transistor coupled between the first clock terminal and a fourth transistor, and having a gate electrode coupled to the second clock terminal;
the fourth transistor coupled between the third transistor and the second node, and having a gate electrode coupled to the first node; and
a fifth transistor coupled between the first node and the third node, and having a gate electrode coupled to the second clock terminal.

16. The scan driver of claim 15, wherein the first driver further comprises:
a first auxiliary transistor coupled between the third and fourth transistors, and having a gate electrode coupled to the second clock terminal; and
a second auxiliary transistor coupled between the fifth transistor and the third node, and having a gate electrode coupled to the second clock terminal.

17. The scan driver of claim 15, wherein the first driver further comprises a sixth transistor coupled between the second node and the first clock terminal, and having a gate electrode coupled to the first clock terminal.

18. The scan driver of claim 17, wherein the first driver further comprises a third auxiliary transistor coupled between the sixth transistor and the second node, and having a gate electrode coupled to the first clock terminal.

19. The scan driver of claim 12, wherein the second driver comprises:
a seventh transistor coupled between the common terminal and the output terminal, and having a gate electrode coupled to the second node;
an eighth transistor coupled between the output terminal and a ninth transistor, and having a gate electrode coupled to the second node;
the ninth transistor coupled between the eighth transistor and the third node, and having a gate electrode coupled to the third clock terminal; and
a tenth transistor coupled between the third clock terminal and the output terminal, and having a gate electrode coupled to the third node.

20. The scan driver of claim 19, wherein the second driver further comprises an eleventh transistor coupled between the third node and a first voltage terminal, and having a gate electrode coupled to the common terminal.

21. The scan driver of claim 20, wherein the second driver further comprises:
a first capacitor coupled between the common terminal and the second node; and
a second capacitor coupled between the third node and the output terminal.

22. The scan driver of claim 20, wherein the second driver further comprises a fourth auxiliary transistor coupled between the eleventh transistor and the third node, and having a gate electrode coupled to the common terminal.

23. The scan driver of claim 12, wherein the first input terminal of a k-th stage circuit of the stage circuits is coupled to the output terminal of a (k−1)-th stage circuit of the stage circuits,
wherein the second input terminal the k-th stage circuit is coupled to the output terminal of a (k−2)-th stage circuit of the stage circuits, and wherein k is a natural number of 3 or more.

24. The scan driver of claim 23, wherein a first stage circuit of the stage circuits is configured to receive a start signal supplied to the first input terminal and the second input terminal of the first stage circuit.

25. The scan driver of claim 24, wherein the first input terminal of a second stage circuit of the stage circuits is coupled to the output terminal of the first stage circuit, and
wherein the second input terminal of the second stage circuit is configured to receive the start signal.

26. The scan driver of claim 12, wherein differently phased clock signals are supplied to the first clock terminal, to the second clock terminal, and to the third clock terminal, respectively.

* * * * *